(12) United States Patent
Furutani

(10) Patent No.: US 12,336,095 B2
(45) Date of Patent: Jun. 17, 2025

(54) WIRING SUBSTRATE AND METHOD FOR MANUFACTURING WIRING SUBSTRATE

(71) Applicant: IBIDEN CO., LTD., Gifu (JP)

(72) Inventor: Toshiki Furutani, Ogaki (JP)

(73) Assignee: IBIDEN CO., LTD., Ogaki (JP)

( * ) Notice: Subject to any disclaimer, the term of this patent is extended or adjusted under 35 U.S.C. 154(b) by 250 days.

(21) Appl. No.: 18/058,784

(22) Filed: Nov. 25, 2022

(65) Prior Publication Data

US 2023/0171884 A1 Jun. 1, 2023

(30) Foreign Application Priority Data

Nov. 26, 2021 (JP) .................. 2021-192110

(51) Int. Cl.
| | |
|---|---|
| *H05K 1/02* | (2006.01) |
| *H05K 1/11* | (2006.01) |
| *H05K 3/40* | (2006.01) |
| *H05K 3/46* | (2006.01) |

(52) U.S. Cl.
CPC .......... *H05K 1/0298* (2013.01); *H05K 1/115* (2013.01); *H05K 3/4038* (2013.01); *H05K 3/4644* (2013.01); *H05K 2201/096* (2013.01); *H05K 2201/09827* (2013.01); *H05K 2203/107* (2013.01)

(58) Field of Classification Search
CPC .... H05K 1/0298; H05K 1/115; H05K 3/4038; H05K 3/4644
See application file for complete search history.

(56) References Cited

U.S. PATENT DOCUMENTS

| | | | |
|---|---|---|---|
| 2014/0091892 A1* | 4/2014 | Tominaga | H01F 41/005 336/200 |
| 2014/0182889 A1 | 7/2014 | Shin et al. | |
| 2016/0014889 A1* | 1/2016 | Markus | H05K 1/028 174/254 |

(Continued)

FOREIGN PATENT DOCUMENTS

JP 2014-131017 A 7/2014

OTHER PUBLICATIONS

English translation of Search Report issued Oct. 11, 2023 in Taiwanese Application No. 111142953, filed Nov. 10, 2022, 1 page.

*Primary Examiner* — Jeremy C Norris
(74) *Attorney, Agent, or Firm* — Oblon, McClelland, Maier & Neustadt, L.L.P.

(57) ABSTRACT

A wiring substrate includes a first conductor layer including wirings, an interlayer insulating layer formed on and covering the first conductor layer, a wiring layer formed in the interlayer insulating layer and including wirings, a second conductor layer formed on the interlayer insulating layer and including wirings, and a via conductor formed in the interlayer insulating layer such that the via conductor is penetrating through the interlayer insulating layer and connecting the first and second conductor layers. The interlayer insulating layer includes first and second insulating layers such that the wiring layer is formed on a surface of the first insulating layer, and the wiring layer is formed such that an aspect ratio of the wirings in the wiring layer is in the range of 2.0 to 6.0 and that aspect ratios of the wirings in the first and second conductor layers are in the range of 1.0 to 2.0.

20 Claims, 6 Drawing Sheets

(56) References Cited

U.S. PATENT DOCUMENTS

2016/0095215 A1\* 3/2016 Furutani .............. H05K 1/0265
       216/13
2018/0166372 A1 6/2018 Shimizu et al.
2021/0247568 A1\* 8/2021 Shi ....................... H05K 1/0274

\* cited by examiner

WIRING SUBSTRATE AND METHOD FOR MANUFACTURING WIRING SUBSTRATE

CROSS-REFERENCE TO RELATED APPLICATIONS

The present application is based upon and claims the benefit of priority to Japanese Patent Application No. 2021-192110, filed Nov. 26, 2021, the entire contents of which are incorporated herein by reference.

BACKGROUND OF THE INVENTION

Field of the Invention

The present invention relates to a wiring substrate and a method for manufacturing the wiring substrate.

Description of Background Art

Japanese Patent Application Laid-Open Publication No. 2014-131017 describes a multilayer substrate that includes: an insulating layer having a fine pattern layer formed on an upper surface thereof; and an insulating layer having a circuit pattern layer formed on an upper surface thereof. The entire contents of this publication are incorporated herein by reference.

SUMMARY OF THE INVENTION

According to one aspect of the present invention, a wiring substrate includes a first conductor layer including wirings, an interlayer insulating layer formed on the first conductor layer such that the interlayer insulating layer is covering the first conductor layer, a wiring layer formed in the interlayer insulating layer and including wirings, a second conductor layer formed on the interlayer insulating layer and including wirings, and a via conductor formed in the interlayer insulating layer such that the via conductor is penetrating through the interlayer insulating layer and connecting the first conductor layer and the second conductor layer. The interlayer insulating layer includes a first insulating layer and a second insulating layer laminated on the first insulating layer such that the wiring layer is formed on a surface of the first insulating layer on the opposite side with respect to the first conductor layer, and the wiring layer is formed such that an aspect ratio of the wirings in the wiring layer is in the range of 2.0 to 6.0 and that an aspect ratio of the wirings in the first conductor layer and an aspect ratio of the wirings in the second conductor layer are in the range of 1.0 to 2.0.

According to another aspect of the present invention, a method for manufacturing a wiring substrate includes forming a first conductor layer including wirings, forming an interlayer insulating layer such that the interlayer insulating layer covers the first conductor layer, and forming a second conductor layer on the interlayer insulating layer such that the second conductor layer has wirings. The forming of the second conductor layer includes forming a via conductor in the interlayer insulating layer such that the via conductor connects the first conductor layer and the second conductor layer, the forming of the interlayer insulating layer includes forming a first insulating layer such that the first insulating layer covers the first conductor layer, forming a wiring layer including wirings on the first insulating layer by pattern plating, and forming a second insulating layer on the first insulating layer, and the forming of the wiring layer includes forming a resist film on the first insulating layer, and forming, by laser processing, at least one opening corresponding to the wiring layer in the resist film in the pattern plating.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1:
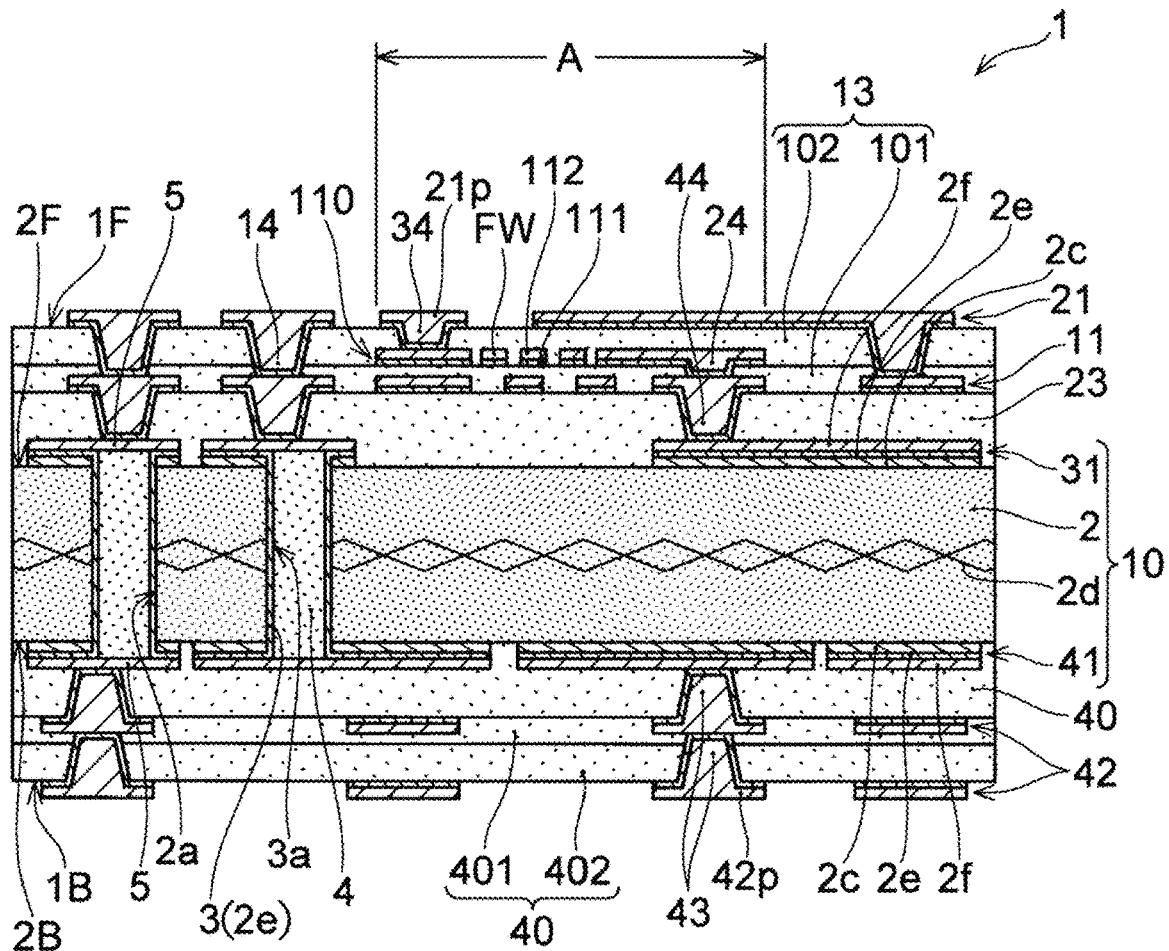
FIG. 1 is a cross-sectional view illustrating an example of a wiring substrate according to an embodiment of the present invention.

Embodiments will now be described with reference to the accompanying drawings, wherein like reference numerals designate corresponding or identical elements throughout the various drawings.

A method for manufacturing a wiring substrate according to an embodiment of the present invention is described with reference to the drawings. The drawings to be referenced below are drawn such that features according to an embodiment of the present invention are easily understood, without intending to show exact proportions of structural elements. FIG. 1 illustrates a cross-sectional view of a wiring substrate 1 as an example of a structure of a wiring substrate according to an embodiment of the present invention.

As illustrated in FIG. 1, the wiring substrate 1 includes an insulating layer (core insulating layer) 2 and two conductor layers (a third conductor layer 31 and a fourth conductor layer 41) that are respectively formed on two main surfaces (a first surface (2F) and a second surface (2B)) of the core insulating layer 2 that oppose each other in a thickness direction. A core substrate 10 of the wiring substrate 1 is formed of the core insulating layer 2, the third conductor layer 31 and the fourth conductor layer 41. The third conductor layer 31 is formed on the first surface (2F) of the core insulating layer 2, and the fourth conductor layer 41 is formed on the second surface (2B) of the core insulating layer 2. The core insulating layer 2 includes through-hole conductors 3 that penetrate the core insulating layer 2 and connect the third conductor layer 31 and the fourth conductor layer 41.

On the first surface (2F) of the core substrate 10, a second interlayer insulating layer 23, a first conductor layer 11, a first interlayer insulating layer 13, and a second conductor layer 21 are laminated in this order from the first surface (2F) side. On the other hand, on the second surface (2B) of the core substrate 10, two interlayer insulating layers 40 and two conductor layers 42 are alternately laminated. In the illustrated example, a surface formed of the first interlayer insulating layer 13 and the second conductor layer 21 forms a first surface (1F) of the wiring substrate 1. Further, a surface formed of the outermost interlayer insulating layer 40 and the outermost conductor layer 42 forms a second surface (1B) of the wiring substrate 1.

In the description of the embodiment, a side farther from the core insulating layer 2 in the thickness direction of the wiring substrate 1 is also referred to as an "upper side," or an "outer side," or simply "upper," and a side closer to the core insulating layer 2 is also referred to as a "lower side," or an "inner side," or simply "lower." Further, for the conductor layers and the interlayer insulating layers, a surface facing the opposite side with respect to the core insulating layer 2 is also referred to as an "upper surface," and a surface facing the core insulating layer 2 side is also referred to as a "lower surface."

In each of the interlayer insulating layers (13, 23, 40), connection conductors (via conductors) are formed that penetrate the each of the interlayer insulating layers and connect the conductor layers that are adjacent to each other via the each of the interlayer insulating layers. In the second interlayer insulating layer 23, fourth via conductors 44 are formed that connect the third conductor layer 31 and the first conductor layer 11. In the first interlayer insulating layer 13, first via conductors 14 are formed that connect the first conductor layer 11 and the second conductor layer 21. In the present embodiment, a length of each of the first via conductors 14 and a length of each of the fourth via conductors 44 are substantially equal to each other. That is, a thickness of the first interlayer insulating layer 13 and a thickness of the second interlayer insulating layer 23 are substantially equal to each other. In the interlayer insulating layers 40, via conductors 43 are formed that connect the conductor layers 42 or connect the fourth conductor layer 41 and the conductor layer 42.

The through-hole conductors 3 are respectively formed in through holes (2a) of the core insulating layer 2 to have a predetermined thickness on inner walls of the through holes (2a) without completely filling through holes (2a). That is, the through-hole conductors 3 respectively have hollow spaces (3a) penetrating the through-hole conductors 3 in the thickness direction of the core insulating layer 2, and as a whole have tubular shapes along the inner walls of the through holes (2a). The through-hole conductors 3 may be formed of, for example, a metal film.

Preferably, the hollow spaces (3a) are substantially completely filled with a resin 4. A material of the resin 4 is not particularly limited as long as the material can fill the hollow spaces (3a). The resin 4 may be non-conductive or conductive. The resin 4 may be, for example, an insulating resin such as an epoxy resin, an acrylic resin, or a phenol resin, or a conductive paste or conductive ink containing conductive particles such as silver particles, an epoxy resin, and the like. As the resin 4, a resin or the like having a thermal expansion coefficient close to that of the core insulating layer 2 may be selected. It may be possible that a thermal stress generated in the core insulating layer 2 is reduced.

The first conductor layer 11, the second conductor layer 21, the third conductor layer 31, the fourth conductor layer 41 and the conductor layers 42, and the first via conductors 14, the fourth via conductors 44, the via conductors 43 and the through-hole conductors 3 may be formed using any metal such as copper or nickel. Each of the first conductor layer 11, the second conductor layer 21, the conductor layers 42, the first via conductors 14, the fourth via conductors 44, and the via conductors 43 has a two-layer structure in the example of FIG. 1, but may have a single-layer structure or a laminated structure with any number of layers. In the example of FIG. 1, each of the conductor layers (11, 21, 42) and the via conductors (14, 44, 43) includes, for example, a metal film formed by electroless plating or sputtering or the like and a plating film formed on the metal film by electrolytic plating using the metal film as a power feeding layer. The first via conductors 14 are integrally formed with the second conductor layer 21. The fourth via conductors 44 are integrally formed with the first conductor layer 11. And, the via conductors 43 are integrally formed with the conductor layers 42.

In the example of FIG. 1, the through-hole conductors 3 are formed by a first plating film (2e) on the inner walls of the through holes (2a) so as to cover the inner walls. That is, the first plating film (2e) is formed in a tubular shape with the thickness direction of the core insulating layer 2 as an axial direction thereof. The first plating film (2e) may be formed of, for example, an electroless plating film, which is formed on the inner walls of the through holes (2a), and an electrolytic plating film, which is formed using the electroless plating film as a power feeding layer and is formed on an inner side of the electroless plating film in the through holes (2a) so as to cover the electroless plating film. However, the through-hole conductors 3 may be formed of a plating film with any number of layers equal to or larger than one. In FIG. 1, the first plating film (2e) is illustrated as a single-layer metal film.

Each of the third conductor layer 31 and the fourth conductor layer 41 has a laminated structure with three or less layers. In the example of FIG. 1, the laminated structure of each of the third conductor layer 31 and the fourth conductor layer 41 is a three-layer structure. The three-layer structure includes, for example, a metal foil (2c) laminated on the first surface (2F) and the second surface (2B) of the core insulating layer 2, a first plating film (2e) on the metal foil (2c), and a second plating film (2f) on the first plating film (2e). The second plating film (2f) is illustrated in FIG. 1 as a single-layer metal film having a one-layer structure. However, similar to the first plating film (2e), the second plating film (2f) may be formed of an electroless plating film and an electrolytic plating film formed on the electroless plating film by electrolytic plating using the electroless plating film as a power feeding layer.

The metal foil (2c) may be formed of any metal, and is, for example, a foil body such as a copper foil or a nickel foil. The metal foil (2c) is, for example, a copper foil bonded to the core insulating layer 2 by thermocompression. The first plating film (2e) and the second plating film (2f) are formed, for example, using any metal such as copper or nickel. Each of the first plating film (2e) and the second plating film (2f) may include a metal film such as a sputtering film formed by sputtering instead of an electroless plating film.

However, instead of a three-layer structure, each of the third conductor layer 31 and the fourth conductor layer 41 may be formed of, for example, a two-layer structure including a metal foil (2c) and a thick first plating film (2e) formed on the metal foil (2c).

Each of the conductor layers (11, 21, 31, 41, 42) may include any conductor patterns. In the example of FIG. 1, the third conductor layer 31 and the fourth conductor layer 41 include conductor pads 5 provided at positions overlapping with the through-hole conductors 3 in a plan view. The term "plan view" means viewing the wiring substrate of the embodiment along the thickness direction thereof.

That is, the conductor pads 5 have a function of so-called through-hole pads of the through-hole conductors 3. The conductor pads 5 are also provided at positions overlapping with the through holes (2a) and the hollow spaces (3a) in a plan view. The conductor pads 5 close the through holes (2a) and the hollow spaces (3a). Therefore, the conductor pads 5 are also so-called cover pads of the through-hole conductors 3. The through holes (2a) and the hollow spaces (3a) are sandwiched between the conductor pads 5 of the third conductor layer 31 and the conductor pads 5 of the fourth conductor layer 41. When such conductor pads 5 as cover pads are provided, as illustrated in FIG. 1, the fourth via conductors 44 or the via conductors 43 of the wiring substrate 1 can be provided directly above the through-hole conductors 3.

In the present embodiment, the first interlayer insulating layer 13 has a two-layer structure. The two-layer structure includes a first insulating layer 101, which is laminated on the second interlayer insulating layer 23 and the first conductor layer 11, and a second insulating layer 102 on the first insulating layer 101. A wiring layer 110 is partially formed on a surface of the first insulating layer 101 on the opposite side with respect to the first conductor layer 11. The second insulating layer 102 covers the first insulating layer 101 and the wiring layer 110. The wiring layer 110 is formed to have fine wirings (FW) formed as relatively fine patterns. FIG. 1 illustrates an example in which, among the two interlayer insulating layers 40, the outer interlayer insulating layer 40 has a two-layer structure formed of an insulating layer 401 and an insulating layer 402. However, the interlayer insulating layer 40 may have a one-layer structure. When the interlayer insulating layer 40 has a two-layer structure, the via conductors 43 connecting the conductor layers 42 are formed to penetrate the two layers at the same time.

The core insulating layer 2, the second interlayer insulating layer 23, the interlayer insulating layers 40, and the first interlayer insulating layer 13, that is, the first insulating layer 101 and the second insulating layer 102, are formed using any insulating resin. An example of the insulating resin is a thermosetting resin such as an epoxy resin, a bismaleimide triazine resin (BT resin), or a phenol resin. Each of the insulating layers may further contain an inorganic filler (not illustrated in the drawings) formed of fine particles of silica (SiO2), alumina, mullite, or the like. In the example of FIG. 1, the core insulating layer 2 contains a core material (reinforcing material) (2d) formed of a glass fiber, an aramid fiber, or the like.

In the example of FIG. 1, similar to the first conductor layer 11, the second conductor layer 21, and the conductor layers 42, the wiring layer 110 has a two-layer structure. The wiring layer 110 includes a metal film layer 111 such as an electroless plating film layer, and an electrolytic plating film layer 112 formed on the metal film layer 111 by electrolytic plating using the metal film layer 111 as a power feeding layer.

The fine wirings (FW) are formed to have a higher aspect ratio than wirings included in the first conductor layer 11 and the second conductor layer 21. For example, the aspect ratio of the fine wirings (FW) may be 2.0 or more and 6.0 or less. On the other hand, the aspect ratio of the wirings included in the first conductor layer 11 and the second conductor layer 21 may be 1.0 or more and 2.0 or less.

The fine wirings (FW) are formed as wiring patterns having relatively small line widths and inter-wiring distances. For example, smallest line width and inter-wiring distance of the fine wirings (FW) are about 0.5 µm-3.0 µm. Preferably, the smallest line width of the fine wirings (FW) included in the wiring layer 110 is smaller than the smallest line width of the wirings included in the first conductor layer 11 and the second conductor layer 21. Further, the inter-wiring distance between closest wirings of the fine wirings (FW) included in the wiring layer 110 may be smaller than the inter-wiring distance between the closest wirings in the first conductor layer 11 and the second conductor layer 21.

The wiring layer 110 is connected to the first conductor layer 11 via second via conductors 24. That is, the second via conductors 24 connecting the wiring layer 110 and the first conductor layer 11 are formed in the first insulating layer 101. Further, the wiring layer 110 is connected to the second conductor layer 21 via third via conductors 34. That is, the third via conductors 34 connecting the wiring layer 110 and the second conductor layer 21 are formed in the second insulating layer 102.

The conductor patterns of the second conductor layer 21 include connection pads (21p). The connection pads (21p) are formed such that a component (not illustrated in the drawings) to be mounted on the wiring substrate 1 when the wiring substrate 1 is used can be placed thereon. That is, the connection pads (21p) are component mounting pads to be used as connecting parts when an external component is mounted on the wiring substrate 1, and the first surface (1F) of the wiring substrate 1 may be a component mounting surface having at least one component mounting region (A) in which a component can be mounted. Electrodes of an electronic component may be electrically and mechanically connected to the component mounting pads (connection pads) (21p), for example, via a bonding material (not illustrated in the drawings) such as solder. Examples of components that may be mounted on the wiring substrate 1 include electronic components such as active components such as semiconductor integrated circuit devices and transistors.

The second surface (1B) of the wiring substrate 1 may be a connecting surface to be connected to an external wiring substrate, for example, an external element such as a motherboard of any electrical device, when the wiring substrate 1 itself is mounted on the external element. Further, similar to the first surface (1F), the second surface (1B) may be a component mounting surface on which an electronic component such as a semiconductor integrated circuit device can be mounted. Without being limited to these, connection pads (42p) forming the second surface (1B) may be connected to any substrate, electrical component, or mechanism element, or the like.

In the example illustrated in FIG. 1, the wiring layer 110 is connected to the component mounting pads (connection pads) (21p) of the second conductor layer 21 via the third via conductors 34. It is possible to form the wiring layer 110 only on the component mounting surface side of the wiring substrate 1. Further, it is possible to partially form the wiring layer 110 only below the component mounting region (A) of the wiring substrate 1. For example, the wiring layer 110 may be formed so as to at least partially overlap the component mounting region (A) in a plan view. That is, in the present embodiment, the wiring layer 110 is formed only in a predetermined region, not on the entire surface of the first insulating layer 101. In a region where the wiring layer 110 is not formed, as illustrated in FIG. 1, the first via conductors 14 connecting the first conductor layer 11 and the second conductor layer 21 are formed penetrating two layers, the first insulating layer 101 and the second insulating layer 102. In the present embodiment, since the wiring layer 110 including the fine wirings (FW) is formed only at a predetermined position, a manufacturing yield of the wiring substrate 1 is expected to improve.

The second via conductors 24 and the third via conductors 34 may be formed of the same material and have the same structure as the first via conductors 14, the fourth via conductors 44, and the via conductors 43. That is, the second via conductors 24 and the third via conductors 34 may be formed using any metal such as copper or nickel. For example, each of the second via conductors 24 and the third via conductors 34 may be formed of a metal film formed by electroless plating or the like, and an electrolytic plating film formed by electrolytic plating using the metal film as a power feeding layer. The second via conductors 24 are integrally formed with the wiring layer 110. The third via conductors 34 are integrally formed with the second conductor layer 21.

Each of the second via conductors 24 and the third via conductors 34 has a smaller via diameter than that of each of the first via conductors 14, the fourth via conductors 44 and the via conductors 43. That is, the first interlayer insulating layer 13 includes at least two types of via conductors having different via diameters. Here, the term "via diameter" is a top diameter (a diameter of an end surface of a via conductor on a surface side of the wiring substrate 1) of each via conductor, and means a maximum value among distances between two points belonging to a perimeter of the end surface.

It may be possible that the fine wirings (FW) are wirings for signal transmission, and the signals can be high frequency signals. Therefore, the first insulating layer 101 and the second insulating layer 102, which are in contact with the wiring layer 110, preferably have excellent high frequency characteristics. When an insulating layer in contact with wirings has relatively high permittivity and dielectric loss tangent, a dielectric loss (transmission loss) of a high frequency signal transmitted via the wirings is relatively large. The dielectric loss tends to be large when the frequency of the signal is high. In particular, when a high frequency signal in the microwave or millimeter wave region is transmitted, the dielectric loss can be significantly large. Therefore, for the first insulating layer 101 and the second insulating layer 102, which are in contact with the wiring layer 110, a material having relatively small permittivity and dielectric loss tangent is preferably used. For example, the material preferably has a relative permittivity of 3.3 or less and a dielectric loss tangent of 0.03 or less, at a frequency of 1 GHz. Since all the insulating layers in contact with the wiring layer 110 have excellent high frequency characteristics, the wiring layer 110 can have an even more excellent signal transmission quality.

With reference to FIGS. 2A-2K, a method for manufacturing the wiring substrate of the embodiment is described using a case where the wiring substrate 1 illustrated in FIG. 1 is manufactured as an example. Structural elements formed in the manufacturing method to be described below may be formed using the materials exemplified as the materials of the corresponding structural elements in the description of the wiring substrate 1 in FIG. 1, unless otherwise specified.

Figure 2A:
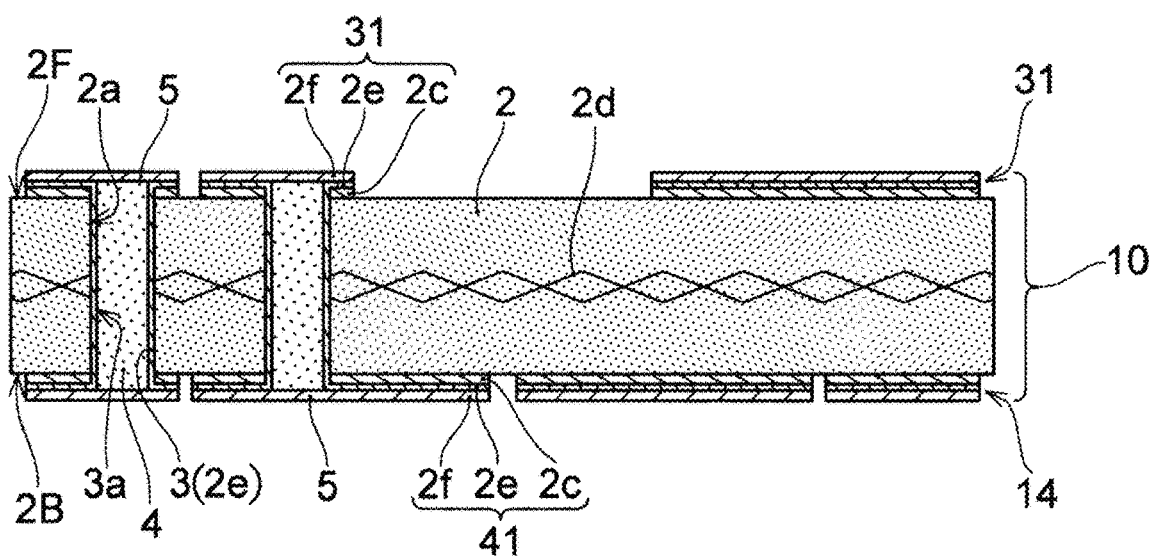
FIG. 2A is a cross-sectional view illustrating a method for manufacturing the wiring substrate of the embodiment.

First, a substrate (starting substrate) including the core insulating layer 2 and the metal foil (2c) laminated on both sides of the core insulating layer 2 is prepared. The core insulating layer 2 is formed of, for example, any insulating resin such as epoxy resin, a BT resin, or a phenol resin. As illustrated in FIG. 2A, the core insulating layer 2 contains the core material (2d). However, it is also possible that the core insulating layer 2 does not contain the core material (2d). The metal foil (2c) is formed of, for example, any metal such as copper or nickel. The metal foil (2c) is bonded to both sides of the core insulating layer 2 using any method such as thermocompression bonding. For example, a double-sided copper-clad laminated plate may be prepared as the starting substrate.

Next, the through holes (2a) penetrating the core insulating layer 2 and the metal foil (2c) are formed. The through holes (2a) may be formed, for example, by irradiating laser such as $CO_2$ laser from the first surface (2F) side and/or the second surface (2B) side of the core insulating layer 2. It is also possible that the through holes (2a) are formed by drilling. The through holes (2a) may be formed using any formation method.

Next, the first plating film (2e) is formed on the entire surface of the metal foil (2c) on the opposite side with respect to the core insulating layer 2, on exposed end surfaces of the metal foil (2c) facing the through holes (2a), and on the inner walls of the through holes (2a). The first plating film (2e) is formed of, for example, an electroless plating film and an electrolytic plating film. After the electroless plating film formed of any metal such as copper or nickel is formed by electroless plating, the electrolytic plating film is formed on the electroless plating film by electrolytic plating using the electroless plating film as a power feeding layer. It is also possible that, instead of the electroless plating film, a metal film such as a sputtering film formed by sputtering is formed. It is also possible that the first plating film (2e) is formed of a single-layer plating film. The first plating film (2e) having a desired thickness is formed.

By forming the first plating film (2e) on the end surfaces of the metal foil (2c) exposed in the through holes (2a) and on the inner walls of the through holes (2a), the through-hole conductors 3 are formed that have the hollow spaces (3a) at the centers thereof are formed of the first plating film (2e) in the through holes (2a). The metal foil (2c) and the first plating film (2e) are sequentially laminated on each of the first surface (2F) and the second surface (2B) of the core insulating layer 2. After the resin 4 is filled into the hollow spaces (3a) and solidified, the second plating film (2f) is formed on the entire surface of the core insulating layer 2 on the first surface (2F) side and on the second surface (2B) side. Similar to the first plating film (2e), the second plating film (2f) may be formed of an electroless plating film and an electrolytic plating film. For example, an electroless plating film is formed on the entire surface of the core insulating layer 2 on the first surface (2F) side and on the second surface (2B) side, and an electrolytic plating film is formed on the electroless plated film using the electroless plating film as a power feeding layer, and the second plating film (2f) is formed of these two layers.

As a result, the third conductor layer 31 and the fourth conductor layer 41 formed of the metal foil (2c), the first plating film (2e), and the second plating film (2f) are respectively formed on the first surface (2F) side and on the second surface (2B) side of the core insulating layer 2. The core substrate 10 having predetermined conductor patterns is obtained by patterning the third conductor layer 31 and the fourth conductor layer 41 using a subtractive method. The third conductor layer 31 and the fourth conductor layer 41 include the conductor pads 5 that close the through holes (2a) and the hollow spaces (3a).

Figure 2B:
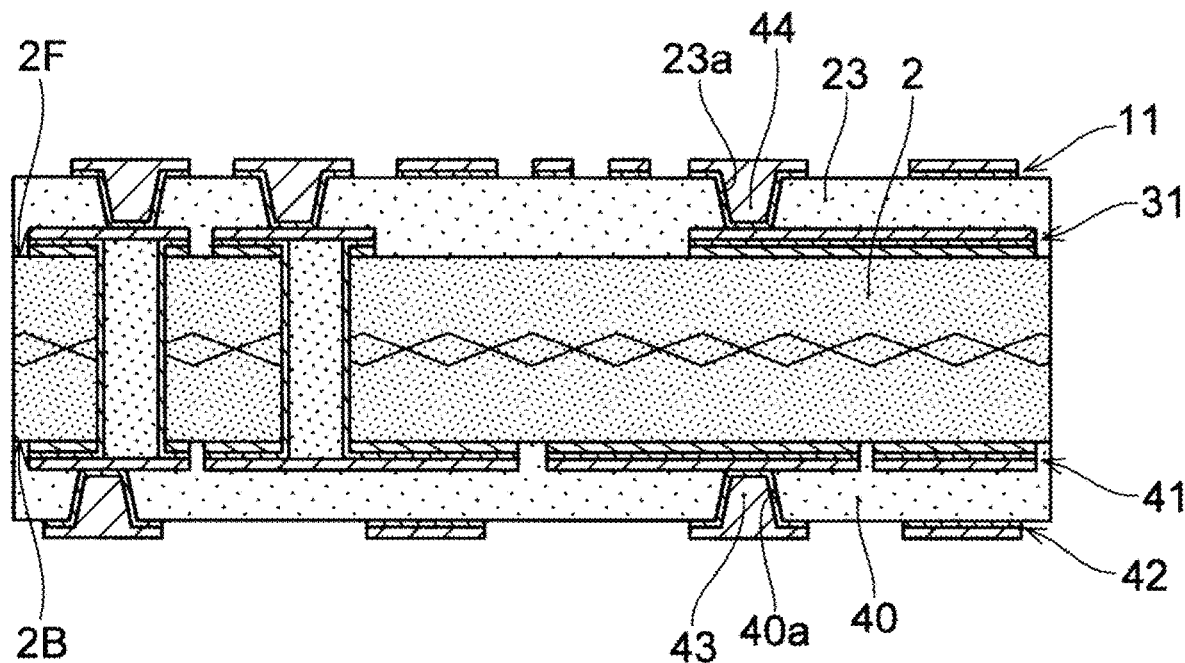
FIG. 2B is a cross-sectional view illustrating a method for manufacturing a wiring substrate according to an embodiment of the present invention.

As illustrated in FIG. 2B, the second interlayer insulating layer 23 and the first conductor layer 11 are formed on the first surface (2F) side of the core insulating layer 2, and the interlayer insulating layer 40 and the conductor layer 42 are formed on the second surface (2B) side of the core insulating layer 2. In the formation of the second interlayer insulating layer 23 and the interlayer insulating layer 40, on the first surface (2F) of the core insulating layer 2 and on the third conductor layer 31, and on the second surface (2B) of the core insulating layer 2 and on the fourth conductor layer 41, for example, a film-like epoxy resin is laminated and is heated and pressed. As a result, the second interlayer insulating layer 23 and the interlayer insulating layer 40 are formed. Through holes (23a) for forming the fourth via conductors 44 in the second interlayer insulating layer 23, and through holes (40a) for forming the via conductors 43 in the interlayer insulating layer 40, are formed, for example, by irradiation with $CO_2$ laser or the like.

Each of the first conductor layer 11 and the conductor layer 42 is formed, for example, using a semi-additive method. That is, a metal film is formed on the surfaces of the second interlayer insulating layer 23 and the interlayer insulating layer 40 and in the through the holes (23a, 40a) by electroless plating or sputtering. An electrolytic plating film is formed by pattern plating including electrolytic plating using the metal film as a power feeding layer. After that, unwanted portions of the metal film are removed, for example, by etching or the like. As a result, the first conductor layer 11 and the conductor layer 42, each including predetermined patterns, are formed. The fourth via conductors 44 are formed in the through holes (23a), and the via conductors 43 are formed in the through holes (40a).

Figure 2C:
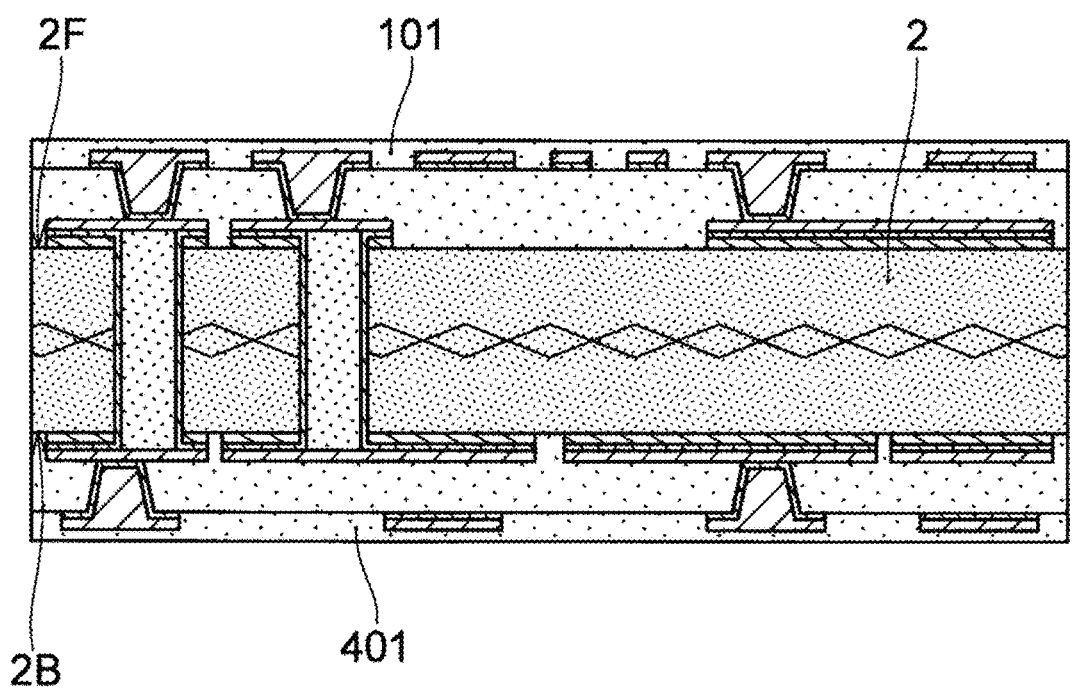
FIG. 2C is a cross-sectional view illustrating a method for manufacturing a wiring substrate according to an embodiment of the present invention.

Next, as illustrated in FIG. 2C, using the same method as that described with reference to FIG. 2B, the first insulating layer 101 is formed on the first surface (2F) side of the core insulating layer 2, and the insulating layer 401 is formed on the second surface (2B) side of the core insulating layer 2.

Figure 2D:
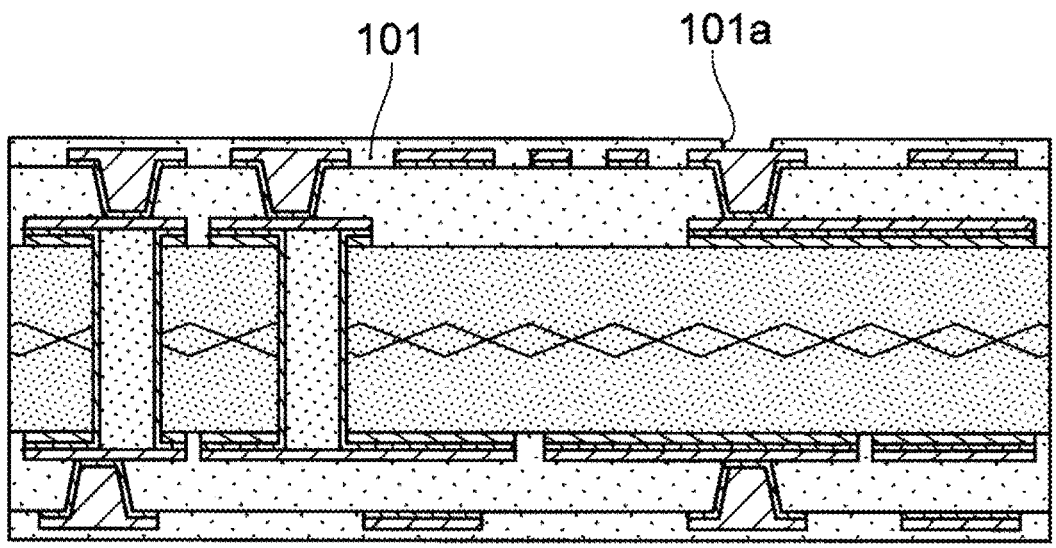
FIG. 2D is a cross-sectional view illustrating a method for manufacturing a wiring substrate according to an embodiment of the present invention.

Next, as illustrated in FIG. 2D, through holes (101a) are formed in the first insulating layer 101 by laser processing. The through holes (101a) are formed at positions at which the second via conductors 24 (see FIG. 1) penetrating the first insulating layer 101 are to be formed. For the formation of the through holes (101a), $CO_2$ laser, which has a relatively long wavelength of about 10 μm, or excimer laser or the like, which has a relatively short wavelength and relatively excellent straightness in processing an insulating layer, may be used.

Figure 2E:
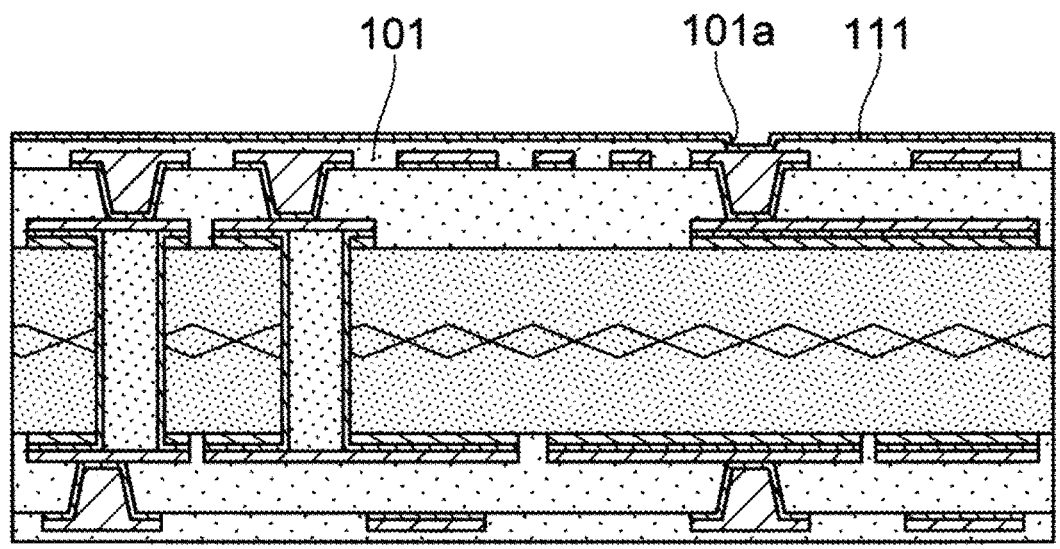
FIG. 2E is a cross-sectional view illustrating a method for manufacturing a wiring substrate according to an embodiment of the present invention.

Next, as illustrated in FIG. 2E, the metal film layer 111 is formed to cover the entire upper surface of the first insulating layer 101 (in the through holes (101a) and on the upper surface of the first insulating layer 101). For example, the metal film layer 111 is formed on the entire upper surface of the first insulating layer 101 by electroless plating or sputtering or the like. The metal film layer 111 covers the through holes (101a) and the entire upper surface of the first insulating layer 101.

Figure 2F:
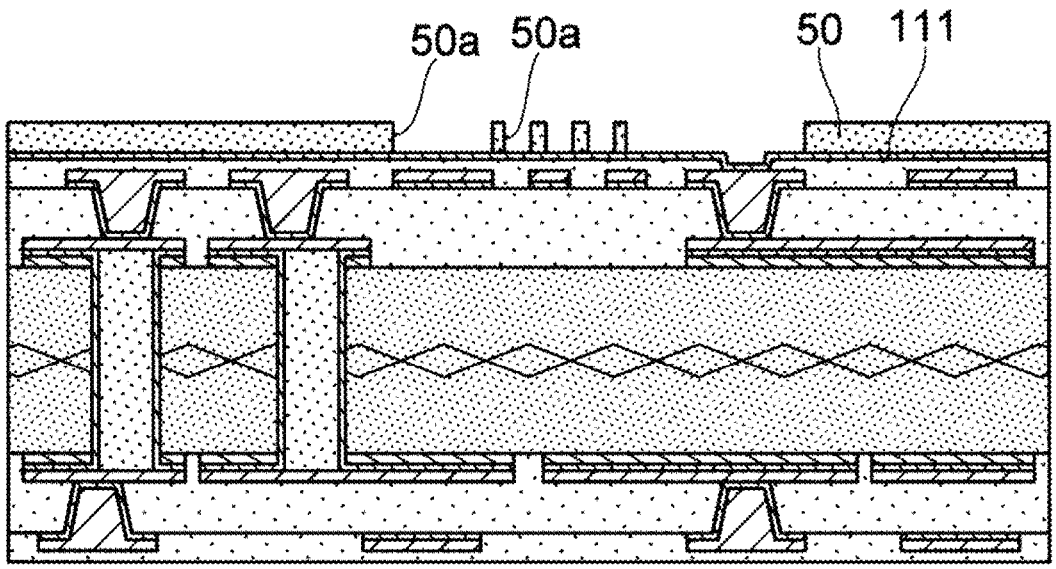
FIG. 2F is a cross-sectional view illustrating a method for manufacturing a wiring substrate according to an embodiment of the present invention.

Next, a resist film 50 is provided on the metal film layer 111. The resist film 50 is formed, for example, by laminating a dry film. As illustrated in FIG. 2F, in the resist film 50, openings (50a) are formed corresponding to the wiring patterns to be formed in the wiring layer 110 (see FIG. 1). The wiring layer 110 is formed by filling the openings (50a) with a metal material of the wiring layer 110. As described above, the fine wirings (FW) are formed as wiring patterns having high aspect ratios and small inter-wiring distances. Therefore, the openings (50a) for forming such fine wirings (FW) are also formed in the resist film 50 with high aspect ratios and small intervals. In order to accurately and stably form the openings (50a), in the present embodiment, the openings (50a) are formed by a dry process using excimer laser. Compared to a conventional etching process or the like in which a chemical is used, it is thought that, by using excimer laser, less tapered openings (50a) are formed and finer patterns are formed. Further, by using a dry process, it is thought that, even when the openings (50a) have high aspect ratios, a problem such as collapsing of the resist film forming walls of the openings (50a), which are formed with fine patterns, does not occur. It is thought that the fine wirings (FW) are satisfactorily formed.

Figure 2G:
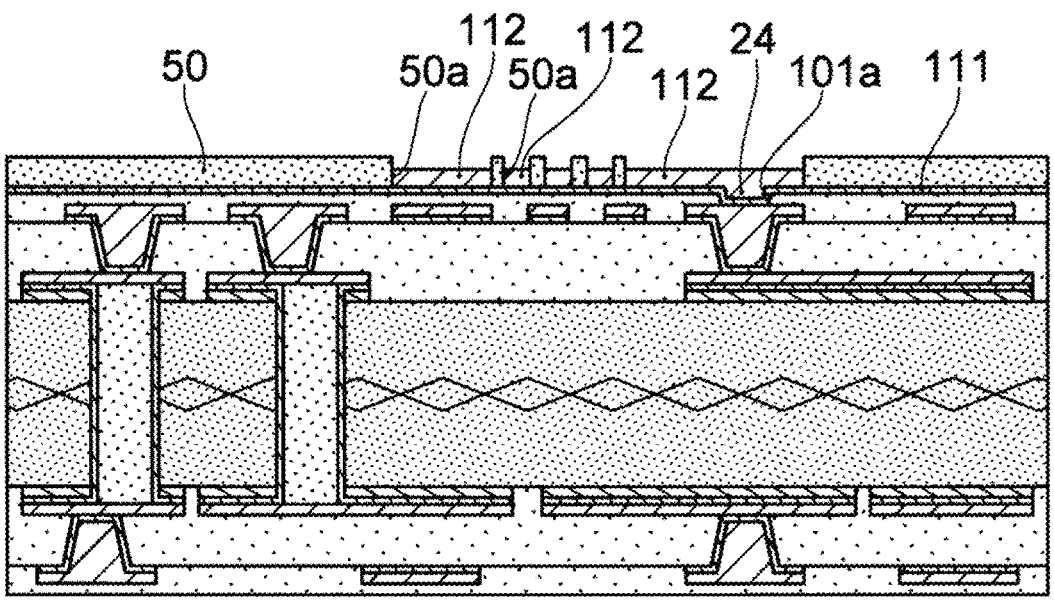
FIG. 2G is a cross-sectional view illustrating a method for manufacturing a wiring substrate according to an embodiment of the present invention.

Next, as illustrated in FIG. 2G, by electrolytic plating using the metal film layer 111 as a seed layer, the electrolytic plating film layer 112 is formed on the metal film layer 111 in the openings (50a). At the same time, the through holes (101a) are also filled with the electrolytic plating film on the metal film layer 111, and the second via conductors 24 are formed.

Figure 2H:
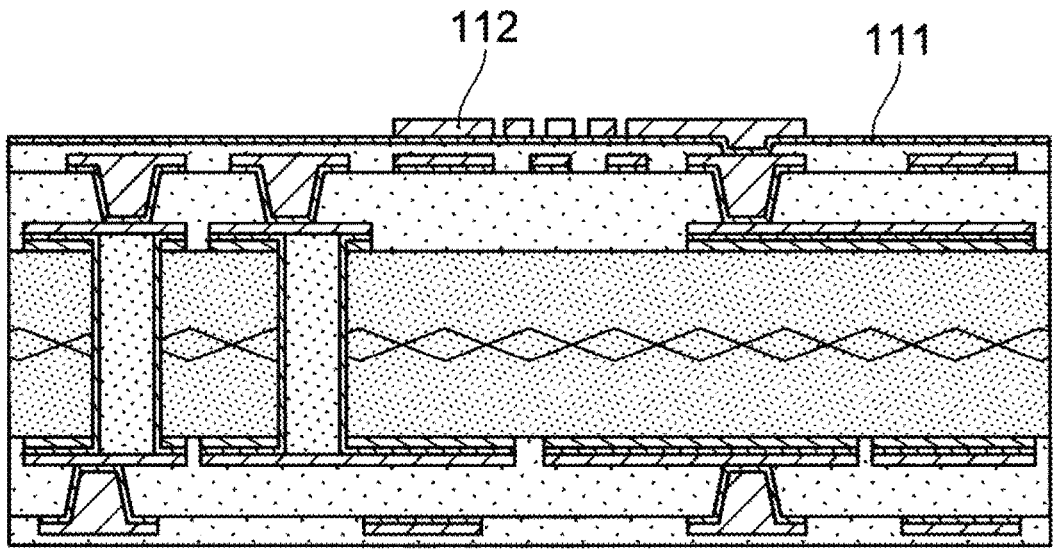
FIG. 2H is a cross-sectional view illustrating a method for manufacturing a wiring substrate according to an embodiment of the present invention.
Figure 2I:
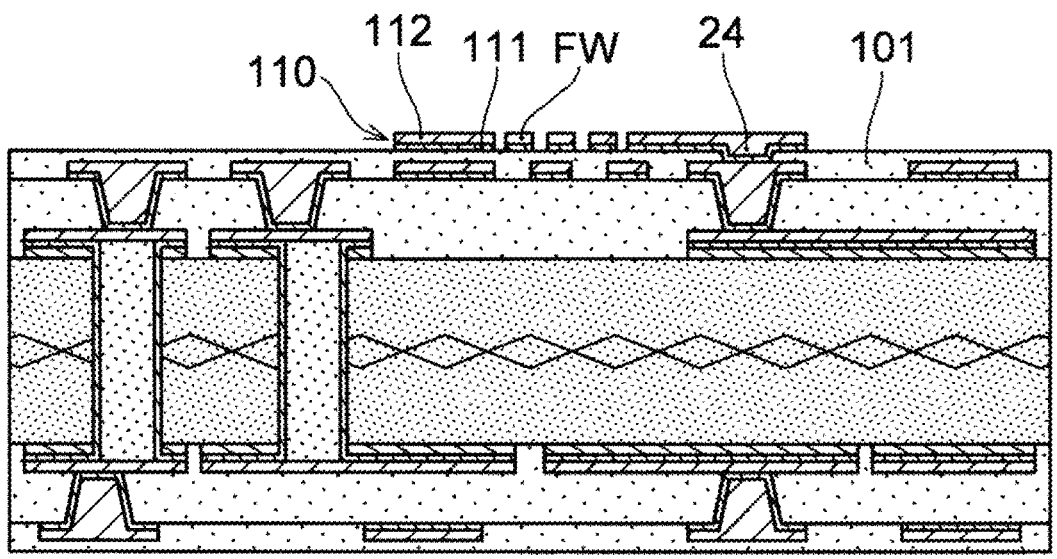
FIG. 2I is a cross-sectional view illustrating a method for manufacturing a wiring substrate according to an embodiment of the present invention.

Next, as illustrated in FIG. 2H, the resist film 50 is peeled off. After that, as illustrated in FIG. 2I, the metal film layer 111 that is not covered by the electrolytic plating film layer 112 is removed by etching. The formation of the wiring layer 110 integrated with the second via conductors 24 is completed, the wiring layer 110 having the fine wirings (FW) having a two-layer structure formed of the metal film layer 111 and the electrolytic plating film layer 112. After that, optionally, for example, of the surface of the wiring layer 110, an exposed surface that is not in contact with the first insulating layer 101 may be roughened using any method such as a surface oxidation treatment called a blackening treatment or a browning treatment or a micro-etching treatment using an acidic solvent.

Figure 2J:
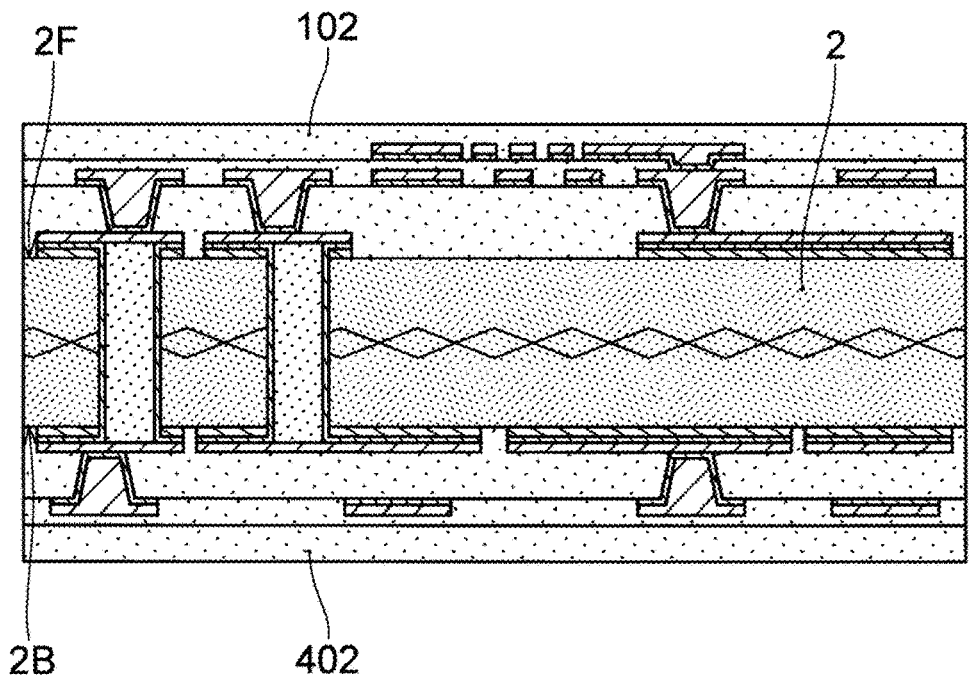
FIG. 2J is a cross-sectional view illustrating a method for manufacturing a wiring substrate according to an embodiment of the present invention.

Next, as illustrated in FIG. 2J, using the same method as that described with reference to FIG. 2B, the second insulating layer 102 is formed on the first surface (2F) side of the core insulating layer 2, and the insulating layer 402 is formed on the second surface (2B) side of the core insulating layer 2.

Figure 2K:
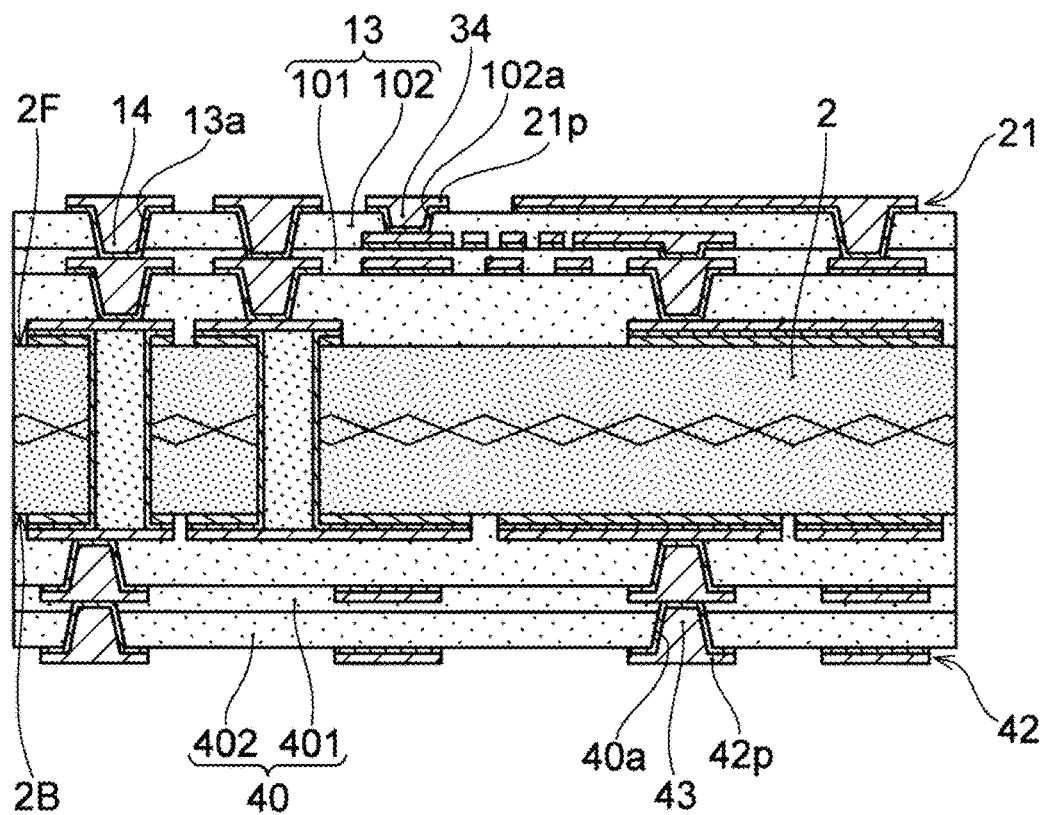
FIG. 2K is a cross-sectional view illustrating a method for manufacturing a wiring substrate according to an embodiment of the present invention.

After that, as illustrated in FIG. 2K, through holes (102a) for forming the third via conductors 34 in the second insulating layer 102, and through holes (13a) for forming the first via conductors 14 penetrating the second insulating layer 102 and the first insulating layer 101, that is, in the first interlayer insulating layer 13, are formed, for example, by irradiation with $CO_2$ laser or the like. Further, through holes (40a) for forming the via conductors 43 penetrating the insulating layer 402 and the insulating layer 401, that is, in the interlayer insulating layer 40, are formed, for example, by irradiation with $CO_2$ laser or the like. Next, using the same method as that described with reference to FIG. 2B, the second conductor layer 21 is integrally formed with the first via conductors 14 and the third via conductors 34 on the first surface (2F) side of the core insulating layer 2, and the conductor layer 42 is integrally formed with the via conductors 43 on the second surface (2B) side of the core insulating layer 2. The second conductor layer 21 is formed to have conductor patterns including the connection pads (21p) for component mounting. The conductor layer 42 is formed to have patterns including the connection pads (42p) for connecting to an external element. Through the above processes, the wiring substrate 1 in the example of FIG. 1 is completed.

The wiring substrate of the embodiment is not limited to those having the structures illustrated in the drawings and those having the structures, shapes, and materials exemplified in the present specification. For example, a wiring layer having fine wirings may be partially formed in any one or more conductor layers among the conductor layers forming the wiring substrate. The wiring substrate may have any number of insulating layers and conductor layers on both sides of the core substrate. Further, a solder resist may be formed on the outermost conductor layers and insulating layers of the wiring substrate. A protective film (not illustrated in the drawings) may be formed on the surfaces of the connection pads (21p, 42p) exposed on the outermost insulating layers of the wiring substrate. For example, the protective film formed of Ni/Au, Ni/Pd/Au, Sn or the like may be formed by plating. An OSP film may be formed by spraying an organic material.

The method for manufacturing the wiring substrate of the present embodiment is not limited to the method described with reference to the drawings. Conditions, processing orders and the like of the method may be appropriately modified. Depending on a structure of an actually manufactured wiring substrate, some of the processes may be omitted, or other processes may be added.

Japanese Patent Application Laid-Open Publication No. 2014-131017 describes a multilayer substrate that includes: an insulating layer having a fine pattern layer formed on an upper surface thereof; and an insulating layer having a circuit pattern layer formed on an upper surface thereof, the circuit pattern layer having a pattern pitch larger than that of the fine pattern layer. The insulating layer having the circuit pattern layer formed on the upper surface thereof is formed of a highly rigid material different from the insulating layer having the fine pattern layer formed on the upper surface thereof.

In the multilayer substrate described in Japanese Patent Application Laid-Open Publication No. 2014-131017, the insulating layer having the circuit pattern layer formed on the upper surface thereof is formed of a highly rigid material, and the insulating layer having the fine pattern layer formed on the upper surface thereof is formed of a material that reduces roughness of the surface in order to enable formation of fine patterns. It may be possible that flatness of the fine pattern layer and the insulating layer having the fine pattern layer formed on the upper surface thereof is not sufficient. A problem such as a connection failure in a circuit may occur.

A wiring substrate according to an embodiment of the present invention includes: a first conductor layer; a first interlayer insulating layer that covers the first conductor layer; a second conductor layer that is formed on the first interlayer insulating layer; and a first via conductor that penetrates the first interlayer insulating layer and connects the first conductor layer and the second conductor layer. The first interlayer insulating layer includes a first insulating layer and a second insulating layer that are laminated in a thickness direction thereof. A wiring layer is partially formed on a surface of the first insulating layer on the opposite side with respect to the first conductor layer. An aspect ratio of wirings included in the wiring layer is 2.0 or more and 6.0 or less, and an aspect ratio of wirings included in the first conductor layer and the second conductor layer is 1.0 or more and 2.0 or less.

A method for manufacturing a wiring substrate according to an embodiment of the present invention includes: forming a first conductor layer; forming a first interlayer insulating layer that covers the first conductor layer; and forming a second conductor layer on the first interlayer insulating layer. The forming of the second conductor layer includes forming a first via conductor connecting the first conductor layer and the second conductor layer in the first interlayer insulating layer. The forming of the first interlayer insulating layer includes: forming a first insulating layer that covers the first conductor layer; and forming a second insulating layer on the first insulating layer. The method for manufacturing a wiring substrate further include forming a wiring layer partially covering the second insulating layer on the first insulating layer by pattern plating. The forming of the wiring layer includes forming, by laser processing, an opening corresponding to the wiring layer in a resist film used in the pattern plating.

According to an embodiment of the present invention, a wiring substrate includes a wiring layer including wirings having fine patterns only in a necessary portion.

Obviously, numerous modifications and variations of the present invention are possible in light of the above teachings. It is therefore to be understood that within the scope of the appended claims, the invention may be practiced otherwise than as specifically described herein.

The invention claimed is:

1. A wiring substrate, comprising:
a first conductor layer comprising a plurality of wirings;
an interlayer insulating layer formed on the first conductor layer such that the interlayer insulating layer is covering the first conductor layer;
a wiring layer formed in the interlayer insulating layer and comprising a plurality of wirings;
a second conductor layer formed on the interlayer insulating layer and comprising a plurality of wirings; and
a via conductor formed in the interlayer insulating layer such that the via conductor is penetrating through the interlayer insulating layer and connecting the first conductor layer and the second conductor layer,
wherein the interlayer insulating layer includes a first insulating layer and a second insulating layer laminated on the first insulating layer such that the wiring layer is formed on a surface of the first insulating layer on an opposite side with respect to the first conductor layer and that the via conductor is formed in a through hole penetrating through the first and second insulating layers in the interlayer insulating layer and connecting the first and second conductor layers, and the wiring layer is formed such that an aspect ratio of the wirings in the wiring layer is in a range of 2.0 to 6.0 and that an aspect ratio of the wirings in the first conductor layer and an aspect ratio of the wirings in the second conductor layer are in a range of 1.0 to 2.0.

2. The wiring substrate according to claim 1, wherein the plurality of wirings in the wiring layer has a smallest line width that is smaller than a smallest line width of the wirings in the first and second conductor layers.

3. The wiring substrate according to claim 2, further comprising:

a second via conductor formed in the first insulating layer of the interlayer insulating layer such that the second via conductor is connecting the first conductor layer and the wiring layer; and a third via conductor formed in the second insulating layer of the interlayer insulating layer such that the third via conductor is connecting the second conductor layer and the wiring layer.

4. The wiring substrate according to claim 3, further comprising:

a third conductor layer;

a second interlayer insulating layer formed on the third conductor layer such that the first conductor layer is formed on the second interlayer insulating layer; and a fourth via conductor formed in the second interlayer insulating layer such that the fourth via conductor is connecting the third conductor layer and the first conductor layer and that each of the second via conductor and the third via conductor has a via diameter that is smaller than a via diameter of each of the first via conductor and the fourth via conductor.

5. The wiring substrate according to claim 2, wherein the plurality of wirings in the wiring layer includes a plurality of wirings configured to transmit signal.

6. The wiring substrate according to claim 2, wherein the plurality of wirings in the wiring layer has an inter-wiring distance between closest wirings that is smaller than an inter-wiring distance between closest wirings in the first conductor layer and the second conductor layer.

7. The wiring substrate according to claim 1, further comprising:

a second via conductor formed in the first insulating layer of the interlayer insulating layer such that the second via conductor is connecting the first conductor layer and the wiring layer; and a third via conductor formed in the second insulating layer of the interlayer insulating layer such that the third via conductor is connecting the second conductor layer and the wiring layer.

8. The wiring substrate according to claim 7, further comprising:

a third conductor layer;

a second interlayer insulating layer formed on the third conductor layer such that the first conductor layer is formed on the second interlayer insulating layer; and a fourth via conductor formed in the second interlayer insulating layer such that the fourth via conductor is connecting the third conductor layer and the first conductor layer and that each of the second via conductor and the third via conductor has a via diameter that is smaller than a via diameter of each of the first via conductor and the fourth via conductor.

9. The wiring substrate according to claim 1, wherein the plurality of wirings in the wiring layer includes a plurality of wirings configured to transmit signal.

10. The wiring substrate according to claim 1, wherein the plurality of wirings in the wiring layer has an inter-wiring distance between closest wirings that is smaller than an inter-wiring distance between closest wirings in the first conductor layer and the second conductor layer.

11. The wiring substrate according to claim 1, wherein the interlayer insulating layer and the second conductor layer is forming a component mounting surface having at least one component mounting region.

12. The wiring substrate according to claim 11, wherein the wiring layer is formed such that the wiring layer is overlapping at least partially with the component mounting region.

13. A method for manufacturing a wiring substrate, comprising:

forming a first conductor layer comprising a plurality of wirings;

forming an interlayer insulating layer such that the interlayer insulating layer covers the first conductor layer; and forming a second conductor layer on the interlayer insulating layer such that the second conductor layer has a plurality of wirings, wherein the forming of the interlayer insulating layer includes forming a first insulating layer such that the first insulating layer covers the first conductor layer, forming a wiring layer comprising a plurality of wirings on the first insulating layer by pattern plating, and forming a second insulating layer on the first insulating layer, the forming of the second conductor layer includes forming a via conductor in a through hole penetrating through the first and second insulating layers in the interlayer insulating layer and connecting the first and second conductor layers such that the via conductor connects the first conductor layer and the second conductor layer, and the forming of the wiring layer includes forming a resist film on the first insulating layer, and forming, by laser processing, at least one opening corresponding to the wiring layer in the resist film in the pattern plating.

14. The method for manufacturing a wiring substrate according to claim 13, wherein the forming of the wiring layer includes forming the plurality of wirings in the wiring layer such that an aspect ratio of the wirings in the wiring layer is in a range of 2.0 to 6.0, the forming of the first conductor layer includes forming the plurality of wirings in the first conductor layer such that an aspect ratio of the wirings in the first conductor layer is in a range of 1.0 to 2.0, and the forming of the second conductor layer includes forming the plurality of wirings in the second conductor layer such that an aspect ratio of the wirings in the second conductor layer is in a range of 1.0 to 2.0.

15. The method for manufacturing a wiring substrate according to claim 13, wherein the laser processing includes laser processing by excimer laser.

16. The method for manufacturing a wiring substrate according to claim 13, wherein the forming of the wiring layer includes roughening a surface of the wiring layer.

17. The method for manufacturing a wiring substrate according to claim 13, wherein the forming of the wiring layer includes forming a second via conductor in the first insulating layer of the interlayer insulating layer such that the second via conductor connects the first conductor layer and the wiring layer, the forming of the second conductor layer includes forming a third via conductor in the second insulating layer of the interlayer insulating layer such that the third via conductor connects the wiring layer and the second conductor layer, and each of the second via conductor and the third via conductor has a via diameter that is smaller than a via diameter of the first via conductor.

18. The method for manufacturing a wiring substrate according to claim 17, wherein the forming of the first conductor layer includes forming the first conductor layer on a second interlayer insulating layer formed on a third conductor layer, and forming a fourth via conductor in the second interlayer insulating layer such that the fourth via conductor connects the first conductor layer and the third conductor layer such that a via diameter of the fourth via conductor is larger than the via diameter of the second via conductor and the via diameter of the third via conductor.

19. The method for manufacturing a wiring substrate according to claim 13, wherein the forming of the wiring layer includes forming the plurality of wirings in the wiring layer such that a smallest line width of the wirings in the wiring layer is smaller than a smallest line width of the wirings in the first conductor layer and a smallest line width of the wirings in the second conductor layer.

20. The method for manufacturing a wiring substrate according to claim 13, wherein the forming of the wiring layer includes forming the wiring layer at a position that the wiring layer at least partially overlaps with a component mounting region on a surface formed by the first interlayer insulating layer and the second conductor layer.

* * * * *